(12) United States Patent
Hattori et al.

(10) Patent No.: US 7,875,155 B2
(45) Date of Patent: Jan. 25, 2011

(54) TRANSPARENT ELECTRICALLY CONDUCTIVE FILM AND METHOD FOR PRODUCTION THEREOF

(75) Inventors: Takeshi Hattori, Chiba (JP); Akira Hasegawa, Ibaraki (JP); Yuzo Shigesato, Kanagawa (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 7 days.

(21) Appl. No.: 12/280,993

(22) PCT Filed: Mar. 15, 2007

(86) PCT No.: PCT/JP2007/055935

§ 371 (c)(1),
(2), (4) Date: Aug. 28, 2008

(87) PCT Pub. No.: WO2007/119497

PCT Pub. Date: Oct. 25, 2007

(65) Prior Publication Data

US 2009/0065746 A1 Mar. 12, 2009

(30) Foreign Application Priority Data

Mar. 16, 2006 (JP) .............................. 2006-072569

(51) Int. Cl.
*H01B 1/08* (2006.01)
*C23C 14/58* (2006.01)
(52) U.S. Cl. .............................. 204/192.15; 252/519.51
(58) Field of Classification Search .............. 252/519.5, 252/519.51, 520.1; 204/192.15
See application file for complete search history.

(56) References Cited

U.S. PATENT DOCUMENTS

| 6,534,183 | B1 * | 3/2003 | Inoue ......................... 428/432 |
| 6,998,070 | B2 * | 2/2006 | Inoue et al. ............. 252/519.51 |
| 2004/0180217 | A1 | 9/2004 | Inoue et al. |
| 2004/0222089 | A1 | 11/2004 | Inoue et al. |
| 2007/0215456 | A1 * | 9/2007 | Abe et al. .............. 204/192.15 |
| 2008/0308774 | A1 | 12/2008 | Inoue et al. |

FOREIGN PATENT DOCUMENTS

| CN | 1558962 A | 12/2004 |
| CN | 101076869 A | 11/2007 |
| JP | 60-68508 | 4/1985 |
| JP | 2004-022268 A | 1/1994 |
| JP | 6-290641 A | 10/1994 |
| JP | 08-171824 A1 | 7/1996 |

(Continued)

OTHER PUBLICATIONS

Minami et al "Highly Transparent and Conductive Zinc-Stannate Thin Films ...", Jap. J. Appl. Phys. vol. 33(1994) pp. L1693-L1696.*

(Continued)

*Primary Examiner*—Mark Kopec
(74) *Attorney, Agent, or Firm*—Sughrue Mion, PLLC

(57) ABSTRACT

The present invention provides a transparent electrically conductive film and a method for producing the same. The transparent electrically conductive film comprises Zn, Sn and O, wherein the molar ratio Zn/(Zn+Sn) of Zn to the sum of Zn and Sn is 0.41 to 0.55, and is amorphous.

1 Claim, 1 Drawing Sheet

FOREIGN PATENT DOCUMENTS

| | | |
|---|---|---|
| JP | 9-035535 A | 2/1997 |
| JP | 09-35535 A1 | 2/1997 |
| JP | 9-286070 A | 11/1997 |
| JP | 2000-256061 A | 9/2000 |
| JP | 2004-22268 A | 1/2004 |
| JP | 2006-194926 A | 7/2006 |
| JP | 2006-196200 A | 7/2006 |
| JP | 2006-196201 A | 7/2006 |
| JP | 2007-314364 * | 12/2007 |
| WO | 2008/084865 | 7/2008 |
| WO | 2008/114850 | 9/2008 |

OTHER PUBLICATIONS

Moriga et al "Transparent conducting amorphous Zn-SnOO films deposited by simultaneous dc sputtering", J. Vac. Sci. Technol. A.22(4) Jul./Aug. 2004 pp. 1705-1710.*

T Minami et al.; Properties of transparent zinc-stannate conducting films prepared radio frequency magnetron sputtering; J. Vac. Sci. Technol. A; 13(3); May/Jun. 1995, pp. 1095-1099.

Minami et al.; Highly Transparent and Conductive Zinc-Stannate Thin Films Perpared RF Magentron Sputtering; Appl. Phys. vol. 33 (1994); Dec. 1, 1994 pp. L 1693-L 1696.

U.S. Appl. No. 12/522,383, filed Jul. 8, 2009, corresponding to WO 2008/084865.

* cited by examiner

TRANSPARENT ELECTRICALLY CONDUCTIVE FILM AND METHOD FOR PRODUCTION THEREOF

TECHNICAL FIELD

The present invention relates to a transparent electrically conductive film and a method for producing the same.

BACKGROUND ART

Transparent electrically conductive films are used as an electrode of displays such as a liquid crystal display, organic EL display and plasma display, or an electrode of solar batteries. The transparent electrically conductive film is required to have sufficient conductivity, and from the standpoint of formation of an electrode pattern, required to have also excellent etching property. Conventionally, there are various suggestions on the transparent electrically conductive film (for example, JP-A No. 8-171824).

Recently, with increase in the size of displays, improvements in conductivity and etching property are desired also for transparent electrically conductive films to be used as an electrode.

DISCLOSURE OF THE INVENTION

The present invention has an object of providing a transparent electrically conductive film excellent in conductivity and etching property, and a method for producing the same.

The present inventors have intensively studied to solve the problem, resultantly leading to completion of the present invention.

That is, the present invention provides a transparent electrically conductive film comprising Zn, Sn and O, wherein the molar ratio Zn/(Zn+Sn) of Zn to the sum of Zn and Sn is 0.41 to 0.55, and is amorphous.

Further, the present invention provides a method for producing a transparent electrically conductive film, comprising a step of sputtering under an inert gas atmosphere, a sintered body target comprising Zn, Sn and O, wherein the molar ratio Zn/(Zn+Sn) of Zn to the sum of Zn and Sn is 0.53 to 0.65.

MODE OF CARRYING OUT THE INVENTION

Transparent Electrically Conductive Film

Figure 1:
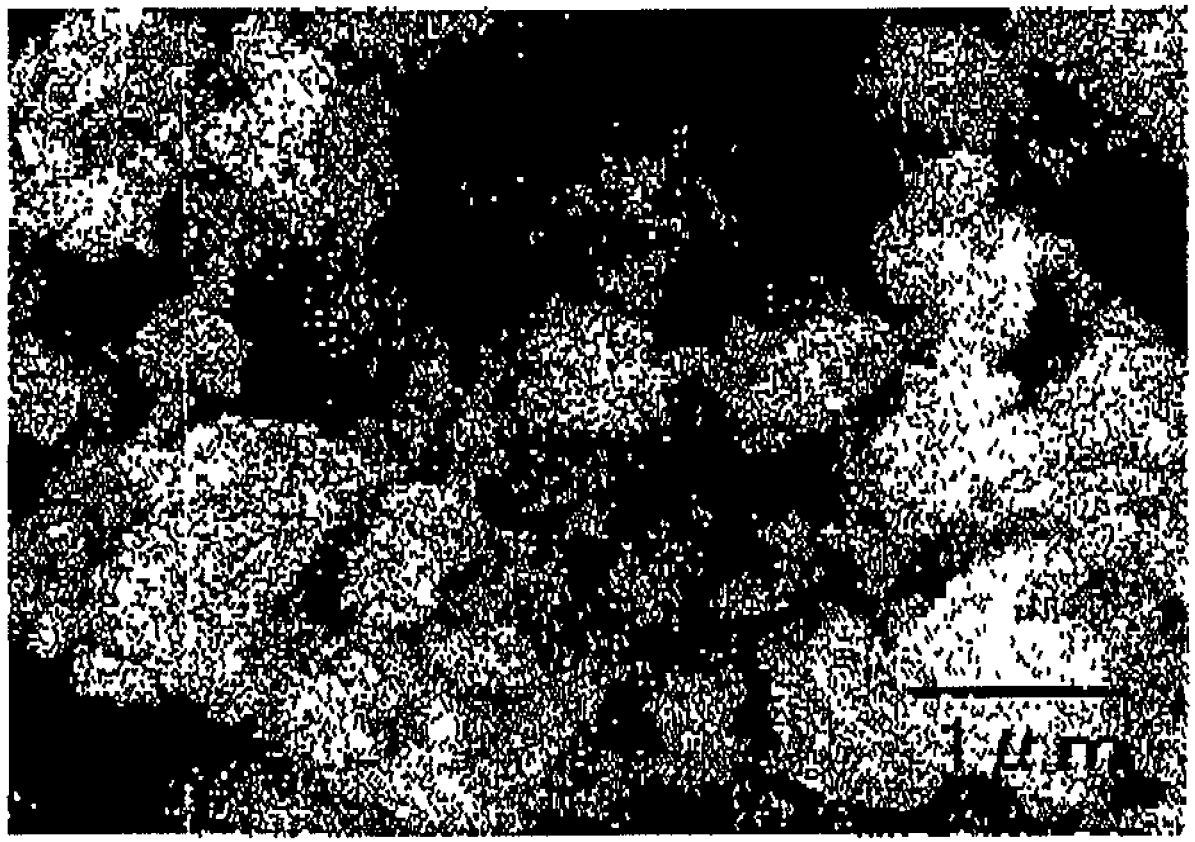
FIG. 1 is an electron micrograph of a calcined material in Example 1.

The transparent electrically conductive film of the present invention includes zinc (Zn), tin (Sn) and oxygen (O), and is usually composed of a metal oxide containing Zn, Sn and O.

The ratio Zn/(Zn+Sn) of the amount (mol) of Zn to the total amount (mol) of Zn and Sn contained in the transparent electrically conductive film is not less than 0.41 and not more than 0.55, and from the standpoint of improvement in etching property, preferably not less than 0.42, further preferably not less than 0.43 and preferably not more than 0.50, further preferably not more than 0.48.

The transparent electrically conductive film is amorphous. Measurement may be advantageously carried out by X-ray diffractometry, and in the instant specification, amorphous means that, for example, in an X-ray diffraction pattern, a diffraction peak derived from crystal is not detected.

The transparent electrically conductive film has a resistivity of usually less than $1 \times 10^{-2}$ Ωcm, preferably not more than $7 \times 10^{-3}$ Ωcm. The resistivity may be advantageously measured by a four-point probe method. The transparent electrically conductive film contains or does not contain aluminum (Al), gallium (Ga) or indium (In), and those not containing them are preferable.

Method for Producing Transparent Electrically Conductive Film

The method for producing a transparent electrically conductive film of the present invention includes a step of sputtering a sintered body used for a target.

The sintered body includes zinc (Zn), tin (Sn) and oxygen (O), and is usually composed of a metal oxide containing Zn, Sn and O.

The ratio Zn/(Zn+Sn) of the amount (mol) of Zn to the total amount (mol) of Zn and Sn contained in the sintered body is not less than 0.53 and not more than 0.65.

The sintered body may be advantageously prepared by a method of, for example, mixing (grinding) zinc oxide and tin oxide, molding the mixture, and sintering the resultant.

Zinc oxide is usually in the form of powder, and has a purity of not less than 99 wt %. Tin oxide is usually in the form of powder, and has a purity of not less than 99 wt %.

In mixing, zinc oxide and tin oxide are so weighed as to satisfy that the ratio Zn/(Zn+Sn) of the amount (mol) of Zn to the total amount (mol) of Zn and Sn contained in the mixture is not less than 0.53, preferably not less than 0.54 and not more than 0.65, preferably not more than 0.61. For example, when a transparent electrically conductive film having a Zn/(Zn+Sn) of not less than 0.41 and not more than 0.55 is produced, zinc oxide and tin oxide may be advantageously so weighed as to satisfy that Zn/(Zn+Sn) is not less than 0.53 and not more than 0.65. When a transparent electrically conductive film having a Zn/(Zn+Sn) of not less than 0.42 and not more than 0.50 is produced, zinc oxide and tin oxide may be advantageously so weighed as to satisfy that Zn/(Zn+Sn) is not less than 0.54 and not more than 0.61. Mixing may be advantageously carried out, for example, by using a ball mill, vibration mill, attritor, Dyno mill or dynamic mill, and may be carried out in dry or wet condition. From the standpoint of improving operability in molding described later, tin oxide, binder, dispersant or lubricant may be added to the mixture. When mixing is carried out in wet condition, the resultant mixture may be dried, and drying may be advantageously carried out, for example, by using a heating dryer, vacuum dryer or freeze dryer.

The mixture may be calcined, and calcination may be advantageously carried out under conditions of keeping at temperatures lower than sintering described later. When the mixture is calcined, it is preferable that a binder, dispersant or lubricant are added to the calcined mixture.

Molding may be advantageously carried out using, for example, a mono-axial press or cold isostatic press (CIP) under condition of a molding pressure of usually 10 to 300 MPa. A green body preferably has a shape such as circular disc and square plate, suitable for sputtering. In molding, operations for adjusting dimension such as cutting and grinding may be combined. Sintering may be advantageously carried out by, for example, maintaining a green body under an oxygen-containing atmosphere (for example, air), under conditions of a highest achievement temperature of not lower than 900° C. and not higher than 1700° C. and a retention time of 0.5 to 48 hours. Sintering may be advantageously carried out by using an electric furnace or gas furnace. Molding and sintering may be effected simultaneously using a hot press or hot isostatic press (HIP). The resultant sintered body may be cut or ground, to adjust dimension.

Sputtering is carried out under an inert gas atmosphere. Examples of the inert gas include argon (Ar). It is preferable that the atmosphere has an inert gas concentration of not less than 99.995%, and contains substantially no oxygen. The oxygen concentration is usually less than 0.05%. Sputtering may be advantageously carried out by, for example, using a radio frequency magnetron sputtering apparatus (rf magnetron sputtering apparatus), under conditions of a radio frequency input power of 100 W to 300 W, an atmospheric pressure of 0.1 Pa to 1 Pa, an atmosphere of Ar gas (using Ar gas cylinder), and a temperature of object (for example, substrate) of room temperature (25° C.) to 300° C.

The resultant transparent electrically conductive film may be thermally treated under a reducing gas containing atmosphere at not lower than 300° C., preferably not lower than 350° C. and not higher than 500° C., preferably not higher than 450° C. By thermal treatment, a transparent electrically conductive film having further lower resistivity is obtained. Examples of the reducing gas include a mixed gas having a hydrogen concentration of 2 to 4 wt % and an inert gas concentration of 98 to 96 wt %.

EXAMPLES

Example 1

Preparation of Sintered Body

A zinc oxide powder (ZnO, manufactured by Wako Pure Chemical Industries, Ltd., guaranteed reagent) and a tin oxide powder ($SnO_2$, manufactured by Roj undo Chemical Laboratory Co., Ltd., purity: 99.99%) were weighed so that Zn/(Zn+Sn) was 0.55, and these powders and ethanol were charged into a wet ball mill (medium: zirconia ball with a diameter of 5 mm) and mixed, to obtain a slurry. The slurry was dried with heating to remove ethanol, obtaining a mixture. The mixture was charged into an alumina crucible, and calcined under an air atmosphere at 900° C. for 5 hours. The calcined product and ethanol were charged into a wet ball mill (medium: zirconia ball having a diameter of 5 mm) and ground, to obtain a slurry. The slurry was dried with heating to remove ethanol. The resultant dried product was dispersed in ethanol, and polyvinyl butyral (manufactured by Sekisui Chemical Co., Ltd., trade name: S-LEC B) was added as a binder, and these were stirred, then, dried to obtain a powder. The powder was charged into dies, and molded using a monoaxial press under condition of a molding pressure of 30 Mpa, to obtain a green body in the form of circular disc. The green body was sintered in air of normal pressure (1 atm) at 1000° C. for 5 hours, to obtain a sintered body.

Production of Transparent Electrically Conductive Film

The sintered body and a glass substrate were set as a sputtering target and as a film forming substrate, respectively, in a sputtering apparatus (manufactured by ANELVA Corporation, L-332S-FHS special type).

An Ar gas (purity: not less than 99.9995%, manufactured by Japan Fine Products Corporation, "Ar pure gas-5N") was introduced into the sputtering apparatus, and sputtering was carried out under conditions of a pressure of 0.5 Pa, an electric power of 100 W and a substrate temperature of 300° C., to form a film on the substrate. The film was analyzed using Auger electron spectroscopy to determine the composition (Zn:Sn). Zn:Sn was 43.4 mol:56.6 mol. The film had a resistivity of $7 \times 10^{-3}$ Ωcm and a carrier concentration of $2 \times 10^{19}$, and was transparent to visible light. The film was analyzed using X-ray diffractometry to determine crystallinity thereof. The film was amorphous. Further, the film was excellent in flatness and homogeneity.

Example 2

The transparent electrically conductive film formed in Example 1 was thermally treated under an Ar gas atmosphere containing 3 wt % of $H_2$ at 400° C. The resultant film had a resistivity of $5 \times 10^{-3}$ Ωcm and was transparent.

Comparative Example 1

A film was formed in the same operation as in Example 1 excepting that the ratio Zn/(Zn+Sn) of a zinc oxide powder and a tin oxide powder was changed to 0.50 from 0.55 in [Preparation of sintered body]. The film had Zn: Sn of 38.9 mol: 61.1 mol and a resistivity of $1 \times 10^{-2}$ Ωcm and was transparent.

Comparative Example 2

A film was formed in the same operation as in Example 1 excepting that the ratio Zn/(Zn+Sn) of a zinc oxide powder and a tin oxide powder was changed to 0.67 from 0.55 in [Preparation of sintered body]. The film had Zn:Sn of 57.8 mol:42.2 mol and a resistivity of 1 Ωcm.

Industrial Applicability

The transparent electrically conductive film of the present invention has low resistivity, that is, excellent in electric conductivity. Further, the transparent electrically conductive film is etched by, for example, a weak acidic oxalic acid aqueous solution (oxalic acid concentration: 2 mol/liter) and excellent in etching property. The transparent electrically conductive film is suitably used as an electrode of displays such as a liquid crystal display, organic EL display, flexible display and plasma display, or an electrode of solar batteries. Further, the transparent electrically conductive film is used also as infrared reflective film for windowpane, an antistatic film or the like.

The invention claimed is:

1. A method for producing a transparent electrically conductive film, the method comprising a step of sputtering under an inert gas atmosphere, using as a target a sintered body comprising Zn, Sn and O wherein the molar ratio Zn/(Zn+Sn) of Zn to the sum of Zn and Sn is 0.53 to 0.65, further comprising a step of thermally treating a transparent electrically conductive film under a reducing gas atmosphere at 300° C. to 500° C., wherein the reducing gas comprises 2 to 4 wt% of hydrogen and 98 to 96 wt % of an inert gas.

* * * * *